United States Patent [19]
Horikoshi et al.

[11] Patent Number: 6,007,871
[45] Date of Patent: Dec. 28, 1999

[54] METHOD OF SURFACE TREATMENT FOR A FISHING TACKLE PART MADE OF ALLOY STEEL CONTAINING CHROME

[75] Inventors: Yasuhiro Horikoshi, Shizuoka; Hiroshi Shinagawa, Kyoto, both of Japan

[73] Assignee: Kiro World Company, Ltd., Japan

[21] Appl. No.: 08/949,622

[22] Filed: Oct. 14, 1997

[30] Foreign Application Priority Data

Nov. 28, 1996 [JP] Japan .................................. 8-318021

[51] Int. Cl.⁶ .................................................. C23C 16/34
[52] U.S. Cl. ............................... 427/255.394; 427/255.4; 427/255.7; 148/230; 148/231
[58] Field of Search .................................... 427/528, 530, 427/255.2, 255.4, 255.7, 255.394; 148/230, 231

[56] References Cited

U.S. PATENT DOCUMENTS 4,953,321  9/1990  Furuta ..................................... 43/43.16

OTHER PUBLICATIONS

Chemical Abstract 124:122833, Min et al., Taehan Kumsok Hakhoechi, 33(8), pp. 1083–1090 (no month), 1995.

*Primary Examiner*—Timothy Meeks
*Attorney, Agent, or Firm*—Wenderoth, Lind & Ponack, L.L.P.

[57] ABSTRACT

The object of the present invention is to provide a simple, inexpensive method of surface treatment capable of improving the strength and smoothness of fishing tackle parts made of alloy steel containing chrome. The method of surface treatment for a fishing tackle part made of alloy steel containing chrome according to the present invention is characterized in that the surface of the fishing tackle part made of alloy steel containing chrome is nitrided to form a diffused layer of chromium nitride from the surface of said part inwards, and then said surface is covered with a layer of titanium nitride. Further, another embodiment of the method of surface treatment for a fishing tackle part made of alloy steel containing chrome according to the present invention is characterized in that the surface of the fishing tackle part made of alloy steel containing chrome is covered with a layer of titanium nitride, and then the surface of said layer of titanium nitride is nitrided to form a diffused layer of chromium nitride from the surface of said part inwards.

2 Claims, No Drawings

METHOD OF SURFACE TREATMENT FOR A FISHING TACKLE PART MADE OF ALLOY STEEL CONTAINING CHROME

BACKGROUND OF THE INVENTION

1. Field of the Invention

The present invention relates to a method of surface treatment for a fishing tackle part made of alloy steel containing chrome.

2. Description of the Related Art

Conventionally, line guides for fishing rods, particularly snake guides (S-shaped guides) have mainly been made of alloy steel containing chrome, such as stainless steel, because of its water and salt resistance. However, in the case of snake guides made of stainless steel, the stainless steel wire used must be quite thick to ensure that the guide itself is strong, adding unwanted weight to the rod. Recently, remarkable improvements have been made in the lightness of materials such as graphite used in fishing rods and rods are becoming lighter, but little improvement has been seen in the line guides attached to the rods, particularly snake guides, and there is room for improved lightness.

Other examples of metal fishing tackle parts include reels and reel seats. These are usually made of brass, stainless steel, aluminum based alloy, etc., but the surface strength of these materials is not yet adequate and there is room for improved resistance. Also, if the surface strength of other metal parts used in reels, such as screws, gears, axles, bearings, ratchets, etc., could be improved, the life of the reel itself would be extended.

Further examples of metal fishing tackle parts include the bobbin holders used in fly tying, where there is a problem with the smoothness of the tip of the metallic pipe through which the silk thread passes, which can cause the thread to break. To reduce this problem, ceramic pipe is being used instead. However, if the tip of the metallic pipe could be smoothened by a simple and inexpensive treatment, bobbin holders made from metallic pipe would be easier to work with.

Thus, the object of the present invention is to provide a simple, inexpensive method of surface treatment capable of improving the strength and smoothness of fishing tackle parts made of alloy steel containing chrome.

SUMMARY OF THE INVENTION

The present invention provides a method of surface treatment for a fishing tackle part made of alloy steel containing chrome characterized in that the surface of the fishing tackle part made of alloy steel containing chrome is nitrided to form a diffused layer of chromium nitride from the surface of said part inwards, and then said surface is covered with a layer of titanium nitride.

Further, the present invention provides a method of surface treatment for a fishing tackle part made of alloy steel containing chrome characterized in that the surface of the fishing tackle part made of alloy steel containing chrome is covered with a layer of titanium nitride, and then the surface of said layer of titanium nitride is nitrided to form a diffused layer of chromium nitride from the surface of said part inwards.

DETAILED DESCRIPTION OF THE INVENTION

The nitriding used in the present invention is a low pressure gas nitriding method which employs the principle of diffusion of nitrogen atoms in a low pressure furnace. In this nitriding method, $NH_3$ and a nitride promoting gas (such as Rx gas) (trade name of Surface Combustion Co. of Japan) are introduced to a furnace filled with fishing tackle parts made of alloy steel containing chrome in which the pressure has been lowered, then the furnace is heated to between 480 and 550° C. and maintained at that temperature for 3 to 5 hours so that the nitrogen diffuses into the alloy steel containing chrome, the base material, to form compounds with the chrome in the alloy.

In the nitriding treatment used in the present invention, nitrogen penetrates and diffuses into the base material from its surface inwards, bonds with chrome in the base material and forms a diffused layer of chromium nitride, so very little change in dimension, such as by warping, expansion etc., occurs in the base material. By this method, the surface of the alloy steel containing chrome can be strengthened greatly. The depth of the strengthened layer, that is, the diffused layer of chromium nitride, can be controlled by adjusting the treatment temperature and the treatment time. Furthermore, parts with intricate shapes and deep holes, fine wires, etc., can be strengthened uniformly. Also, by this method, the strength decreases gradually from the surface inwards, so there is no loss or peeling of the surface layer.

As mentioned above, nitriding forms chromium nitride by a reaction between the chrome present in the alloy steel and the introduced $NH_3$, so the alloy steel undergoing treatment must contain chrome. The treatment can be performed on parts made of alloy steel containing chrome with a chrome content of 3 percent or more by weight. The chrome content should not be less than 3 percent by weight because the amount of chrome contributing to the nitriding is then too small for the marked improvement in surface strength to be achieved.

In the present invention, the alloy steel containing chrome is covered with titanium nitride after performing the above nitriding treatment. This is done because there is a big difference between the surface strength of the alloy steel containing chrome and that of the titanium nitride layer and so, if the titanium nitride is applied directly onto the alloy steel containing chrome, peeling, etc., occurs easily and the inherently high surface hardness of the titanium nitride layer cannot be sufficiently employed to advantage. By performing the nitriding treatment, the surface strength of the alloy steel containing chrome can be raised, thus reducing the difference between the surface strength of the alloy steel containing chrome and that of the titanium nitride layer and thereby preventing peeling, etc., of the titanium nitride layer.

Application of the titanium nitride in the present invention is not limited to any one method, and any of a variety of conventional methods, such as the chemical vapour deposition (CVD) method, the physical vapour deposition (PVD) method, the ion plating method, etc., may be used. Of these, the ion plating method is particularly preferable because it forms a layer at a lower temperature than the CVD method and the adhesion of the layer is also superior.

The thickness of the titanium nitride layer should be between 2 and 10 $\mu$m, and preferably within the range of 2 to 4 $\mu$m. The thickness of the titanium nitride layer should not be less than 2 $\mu$m because practical durability deteriorates, but said thickness should also not be greater 10 $\mu$m because, as will be explained below, when the nitriding treatment is then performed after the application of the titanium nitride layer the nitrogen atoms have trouble penetrating.

By coating the surface of fishing tackle parts made of alloy steel containing chrome with a layer of titanium nitride, not only is the surface strength thereof increased significantly and smoothness achieved, but the titanium nitride can impart its unique golden color to give the fishing tackle parts made of alloy steel containing chrome a more valuable appearance.

According to the other preferred embodiment of the present invention, the titanium nitride layer may also be applied to the surface of fishing tackle parts made of alloy steel containing chrome first and then nitriding performed. By this method, the dimensions of the finished parts are the sum of the dimensions of the alloy steel containing chrome and the titanium nitride layer, and poor quality goods with incorrect dimensions can be weeded out before nitriding is performed. Further, by nitriding the alloy steel containing chrome through the layer of titanium nitride on its surface, the nitriding is applied to both simultaneously and the titanium nitride layer adheres more strongly to the alloy steel containing chrome. However, with this method the unique golden color of the titanium nitride layer may be lost somewhat, so it is an appropriate method for improving the surface strength of parts such as reel gears, etc., where color is not very important but precise dimensions are required.

As described above, according to the present invention, it is possible to form a layer of titanium nitride which has a golden color, is smooth, and adheres strongly to fishing tackle parts made of alloy steel containing chrome.

EXAMPLES

Example 1

Nitriding was performed by placing snake guides composed of SUS 304 (Microvickers hardness: 370 Hv, diameter 1.6 mm) in a low pressure furnace, lowering the pressure to approximately $10^{-3}$ mmHg, introducing a mixture of gases composed of 30 percent by volume of $NH_3$, 10 percent by volume of $H_2$, 5 percent by volume of $O_2$ and the remainder of $N_2$, and maintaining the furnace temperature at 500° C. for 3 hours. After nitriding, the Microvickers hardness had increased to 1200 Hv.

Next, a 2 to 3 μm thick layer of titanium nitride was formed on the surface of the snake guides obtained above by placing them into a vacuum arc discharge ion plating device having metallic titanium as a target and treating them at a bias voltage of 50 V, arc current of 100 A, and nitrogen pressure of 20 mm Torr.

The Microvickers hardness of the snakes guides thus obtained was 2400 Hv. Further, the surface of said snake guides was smooth and had a beautiful golden luster. The layer of titanium nitride adhered strongly to the SUS 304 base material.

When cross sections of the snake guides thus obtained were viewed with a scanning electron microscope, it was confirmed that the diffused layer of chromium nitride had formed in the range of 30 μm from the surface of the SUS 304 base material.

Example 2

A 2 to 3 μm thick layer of titanium nitride was first formed on the surface of snake guides having the same composition as those in Example 1 above by placing them into a vacuum arc discharge ion plating device having metallic titanium as a target and treating them at a bias voltage of 50 V, arc current of 100 A, and nitrogen pressure of 20 mm Torr. The Microvickers hardness of the snakes guides thus obtained was 2400 Hv.

Nitriding was performed on the snake guides thus obtained by placing them in a low pressure furnace, lowering the pressure to approximately $10^{-3}$ mmHg, introducing a mixture of gases composed of 30 percent by volume of $NH_3$, 10 percent by volume of $H_2$, 5 percent by volume of $O_2$ and the remainder of $N_2$, and maintaining the furnace temperature at 500° C. for 3 hours. The surface of the snakes guides thus obtained was smooth. The layer of titanium nitride adhered strongly to the SUS 304 base material.

Compared to the snake guides obtained in Example 1, they had somewhat inferior luster.

When cross sections of the snake guides thus obtained were viewed with a scanning electron microscope, it was confirmed that the diffused layer of chromium nitride had formed in the range of 30 μm from the surface of the SUS 304 base material.

What is claimed is:

1. A method of surface treatment for a fishing tackle part made of alloy steel containing chrome characterized in that the surface of the fishing tackle part made of alloy steel containing chrome is covered with a layer of titanium nitride, and then the surface of said layer of titanium nitride is nitrided to form a diffused layer of chromium nitride from the surface of said part inwards.

2. The method of surface treatment for fishing tackle parts made of alloy steel containing chrome according to claim 1, wherein the alloy steel containing chrome contains 3 percent by weight or more of chrome.

* * * * *